US006858529B2

(12) United States Patent
Chung et al.

(10) Patent No.: US 6,858,529 B2
(45) Date of Patent: Feb. 22, 2005

(54) METHODS OF FORMING CONTACT PLUGS INCLUDING POLYSILICON DOPED WITH AN IMPURITY HAVING A LESSER DIFFUSION COEFFICIENT THAN PHOSPHORUS

(75) Inventors: Eun-Ae Chung, Gyeonggi-do (KR); Myoung-Bum Lee, Seoul (KR); Young-Pil Kim, Gyeonggi-do (KR); Jin-Gyun Kim, Gyeonggi-do (KR); Bean-Jun Jin, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/440,777

(22) Filed: May 19, 2003

(65) Prior Publication Data

US 2004/0000693 A1 Jan. 1, 2004

(30) Foreign Application Priority Data

Jun. 27, 2002 (KR) ................................. 10-2002-0036487

(51) Int. Cl.⁷ .......................................... H01L 21/4763
(52) U.S. Cl. ....................................... 438/629; 438/647
(58) Field of Search ................................. 438/629, 647

(56) References Cited

U.S. PATENT DOCUMENTS

| 5,517,044 A | * | 5/1996 | Koyama ..................... 257/316 |
| 5,567,644 A | * | 10/1996 | Rolfson et al. ............. 438/384 |
| 5,792,695 A | | 8/1998 | Ono et al. |
| 5,804,470 A | * | 9/1998 | Wollesen ..................... 438/141 |
| 6,232,196 B1 | * | 5/2001 | Raaijmakers et al. ....... 438/386 |
| 6,243,285 B1 | * | 6/2001 | Kurth et al. ................. 365/149 |
| 6,274,489 B1 | * | 8/2001 | Ono et al. ................... 438/659 |
| 2003/0049372 A1 | * | 3/2003 | Cook et al. ............... 427/248.1 |

FOREIGN PATENT DOCUMENTS

| KR | 10-1997-0022171 | 5/1997 |
| KR | 10-0232984 | 12/1999 |

OTHER PUBLICATIONS

English Translation of Korean Office Action dated Mar. 23, 2004.

* cited by examiner

*Primary Examiner*—M. Wilczewski
(74) *Attorney, Agent, or Firm*—Myers Bigel Sibley & Sajovec

(57) ABSTRACT

Forming a semiconductor device can include forming an insulating layer on a semiconductor substrate including a conductive region thereof, wherein the insulating layer has a contact hole therein exposing a portion of the conductive region. A polysilicon contact plug can be formed in the contact hole wherein at least a portion of the polysilicon contact plug is doped with an element having a diffusion coeffient that is less than a diffusion coefficient of phosphorus (P). Related structures are also discussed.

32 Claims, 6 Drawing Sheets

METHODS OF FORMING CONTACT PLUGS INCLUDING POLYSILICON DOPED WITH AN IMPURITY HAVING A LESSER DIFFUSION COEFFICIENT THAN PHOSPHORUS

RELATED APPLICATIONS

The present application claims priority from Korean Application No. 2002-0036487 filed Jun. 27, 2002, the disclosure of which is hereby incorporated herein in its entirety by reference.

FIELD OF THE INVENTION

The present invention relates to methods of forming semiconductor devices and, more particularly, to methods of forming contact plugs for semiconductor devices and related structures.

BACKGROUND OF THE INVENTION

Generally, a contact hole of a semiconductor device exposes a conductive layer through an overlying interlayer insulating layer. A contact plug filling the contact hole is electrically connected to the conductive layer. The contact plug may be made of doped polysilicon or metal. A conventional method of forming a semiconductor device having a contact hole is discussed with reference to FIG. 1.

Referring to FIG. 1, a device isolation layer 2 is formed on a P-type semiconductor substrate 1 to define an active region. A gate pattern 5 is formed to cross the active region. The gate pattern 5 includes a gate insulating layer 3 and a gate electrode 4 that are sequentially stacked. N-type impurity diffusion layers 6 and 7 are formed in the active region adjacent opposite sides of the gate pattern 5. The N-type impurity diffusion layers 6 and 7 respectively provide a source region and a drain region. The gate pattern 5, the source region 6, and the drain region 7 make up an NMOS transistor.

An interlayer insulating layer 8 is formed on an entire surface of the semiconductor substrate 1 including the transistor. The interlayer insulating layer 8 is patterned to provide contact holes 9 exposing predetermined areas of the source/drain regions 6 and 7. Contact plugs 10 are formed to fill the contact holes 9. Lower sides of the contact plugs 10 are electrically connected to the source/drain regions 6 and 7. The contact plugs 10 can be plugs of phosphorus-doped polycrystalline silicon (P-doped polysilicon). If phosphorus (P) from the contact plugs 10 diffuses to the source/drain regions 6 and 7, the source/drain regions 6 and 7 may increase in doping concentration and/or expanded diffusion regions "F" may be formed at the source/drain regions 6 and 7.

As semiconductor devices are continuously scaled down, contact resistances between the contact plugs 10 and the source/drain regions 6 and 7 may increase. Accordingly, doping concentrations of the contact plugs 10 may be increased to reduce contact resistances. The source/drain regions 6 and 7 may thus be subjected to greater increases in diffusion and resulting increases in doping concentration, so that the expanded diffusion areas "F" may extend even further. As a result, an energy barrier of the drain region 7 may be reduced with increases in a voltage applied to the drain region 7. Stated in other words, a drain-induced barrier lowering (DIBL) effect may be increased. As the DIBL effect increases, a likelihood of punchthrough between the source and drain regions 6 and 7 may also increase.

SUMMARY OF THE INVENTION

According to embodiments of the present invention, methods of forming a semiconductor device can include forming an insulating layer on a semiconductor substrate including a conductive region thereof, wherein the insulating layer has a contact hole therein exposing a portion of the conductive region. A polysilicon contact plug can be formed in the contact hole wherein at least a portion of the polysilicon contact plug is doped with an element having a diffusion coefficient that is less than a diffusion coefficient of phosphorus (P).

The element having the diffusion coefficient that is less than a diffusion coefficient of phosphorus (P) can be selected from at least one element from Group V of the periodic table such as arsenic and/or antimony. More particularly, the element having the diffusion coefficient that is less than a diffusion coefficient of phosphorus (P) can be arsenic, the conductive region of the semiconductor substrate can be a region of the substrate doped with an N-type dopant, and the substrate can be a P-type substrate.

Forming the polysilicon contact plug can include forming a polysilicon layer in the contact hole and on a surface of the insulating layer opposite the semiconductor substrate, and removing portions of the polysilicon layer from the surface of the insulating layer opposite the semiconductor substrate while maintaining portions of the polysilicon layer in the contact hole. More particularly, removing portions of the polysilicon layer from the surface of the insulating layer can include planarizing the polysilicon layer down to the surface of the insulating layer.

Forming the polysilicon contact plug can include forming a first portion of the polysilicon contact plug that partially fills the contact hole while leaving an unfilled portion of the contact hole, and forming a second portion of the polysilicon contact plug in the unfilled portion of the contact hole. The first portion of the polysilicon contact plug can be formed at a first deposition rate, and the second portion of the polysilicon contact plug can be formed at a second deposition rate wherein the second deposition rate is greater that the first deposition rate.

Forming the polysilicon contact plug can include forming a first portion of the polysilicon contact plug partially filling the contact hole while leaving an unfilled portion of the contact hole, and forming a second portion of the polysilicon contact plug in the unfilled portion of the contact hole. Here, the first portion of the polysilicon contact plug can be doped with the element having the diffusion coefficient that is less than the diffusion coefficient of phosphorus (P), and the second portion of the polysilicon contact plug can be doped with an element different than the element used to dope the first portion of the polysilicon contact plug. More particularly, the first portion of the polysilicon contact plug can be formed using a single wafer type deposition apparatus, and the second portion of the polysilicon contact plug can be formed using a batch type deposition apparatus. In the alternative, the first portion of the polysilicon contact plug can be formed using a single wafer type deposition apparatus, and the second portion of the polysilicon contact plug can be formed using a single wafer type deposition apparatus. In addition, the second portion of the polysilicon contact plug can be doped with phosphorus, and the first portion of the polysilicon contact plug can be doped with arsenic. Moreover, the second portion of the polysilicon contact plug can be doped in-situ or using $POCl_3$.

Forming the insulating layer can be preceded by forming an isolation layer on the semiconductor substrate wherein the isolation layer defines an active region of the substrate not covered by the isolation layer, forming a gate extending across the active region of the substrate, and forming a doped portion of the active region adjacent to the gate thereby defining the conductive region of the substrate. The insulating layer comprises forming a silicon oxide layer which can be formed using chemical vapor deposition. Forming the polysilicon contact plug can include forming at least a portion of the polysilicon contact plug in a single wafer deposition apparatus.

According to additional embodiments of the present invention, a semiconductor device can include a semiconductor substrate having a conductive region on a surface thereof, and an insulating layer on the semiconductor substrate, wherein the insulating layer has a contact hole therein exposing a portion of the conductive region. The device can also include a polysilicon contact plug in the contact hole wherein at least a portion of the polysilicon contact plug is doped with an element having a diffusion coefficient that is less than a diffusion coefficient of phosphorus (P). The element having the diffusion coefficient that is less than a diffusion coefficient of phosphorus (P) can be selected from at least one element from Group V of the periodic table, such as arsenic and/or antimony. More particularly, the element can be arsenic. The conductive region of the semiconductor substrate may include a region of the substrate doped with an N-type dopant, and the substrate may be a P-type substrate.

In addition, the polysilicon contact plug can include first and second portions in the contact hole wherein the first portion is between the second portion and the substrate. The first portion of the polysilicon contact plug is doped with the element having the diffusion coefficient that is less than the diffusion coefficient of phosphorus (P). The second portion of the polysilicon contact plug is doped with an element different than the element used to dope the first portion of the polysilicon contact plug. The second portion of the polysilicon contact plug can be doped with phosphorus, and the first portion of the polysilicon contact plug can be doped with arsenic.

The device can also include an isolation layer, a gate, and a doped portion of the active region. The isolation layer is between the semiconductor substrate and the insulating layer, and the isolation layer defines an active region of the substrate not covered by the isolation layer. The gate extends across the active region of the substrate between the semiconductor substrate and the insulating layer, and the doped portion of the active region is adjacent to the gate and defines the conductive region of the substrate. Moreover, the insulating layer can include a silicon oxide layer.

DESCRIPTION OF EMBODIMENTS

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 6A:
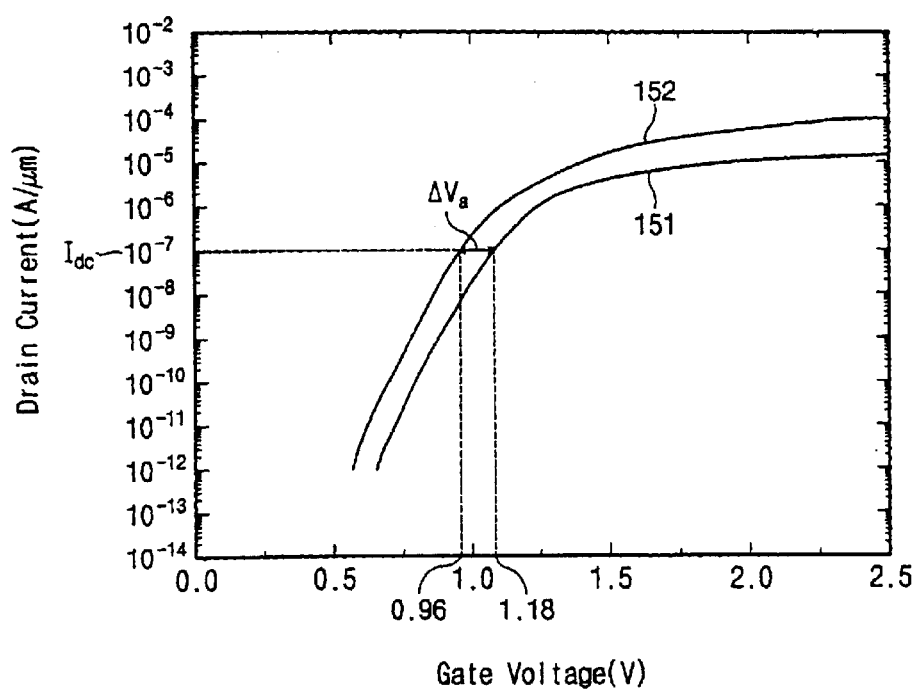
FIG. 6A is a graph illustrating characteristics of a first transistor. Drain current is illustrated as a function of gate voltage.
Figure 6B:
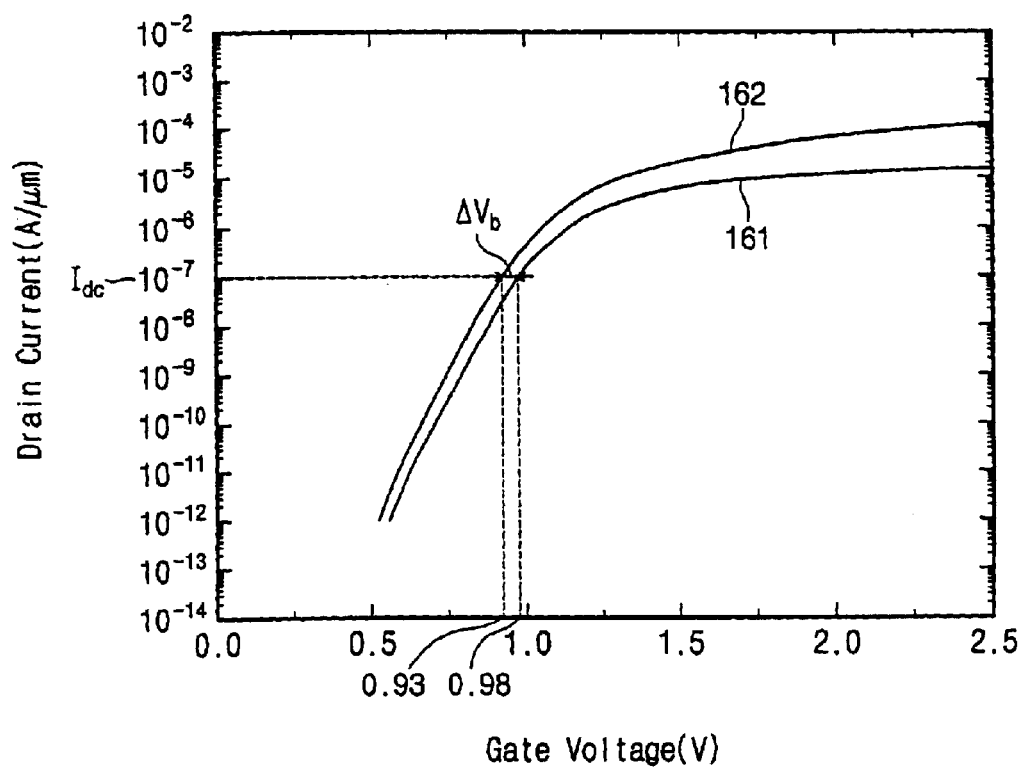
FIG. 6B is a graph illustrating characteristics of a second transistor formed according to embodiments of the present invention. Drain current is illustrated as a function of gate voltage.

FIG. 2 through FIG. 5 are cross-sectional views illustrating steps of forming a semiconductor device according to embodiments of the present invention. FIG. 6A is a graph illustrating characteristics of a first transistor, where drain current is illustrated as a function of gate voltage. FIG. 6B is a graph illustrating the characteristics of a second transistor formed according to embodiments of the present invention, where drain current is illustrated as a function of gate voltage. In FIG. 6A and FIG. 6B, the horizontal axis shows a gate voltage and the vertical axis shows drain current.

Figure 1:
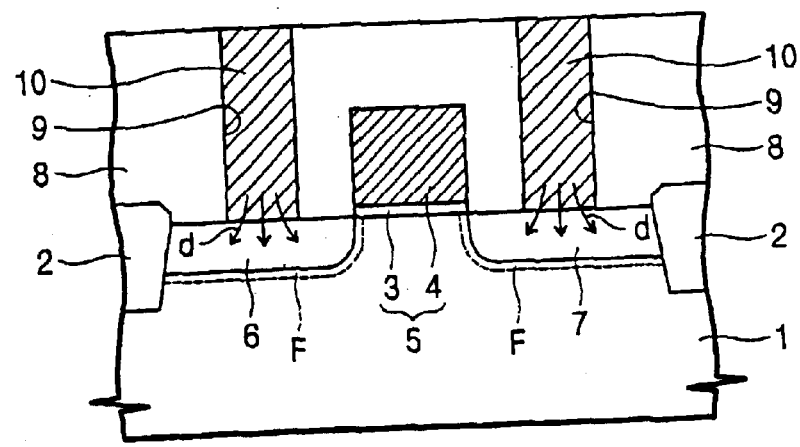
FIG. 1 is a cross-sectional view illustrating a conventional method of forming a semiconductor device having a contact hole.
Figure 2:
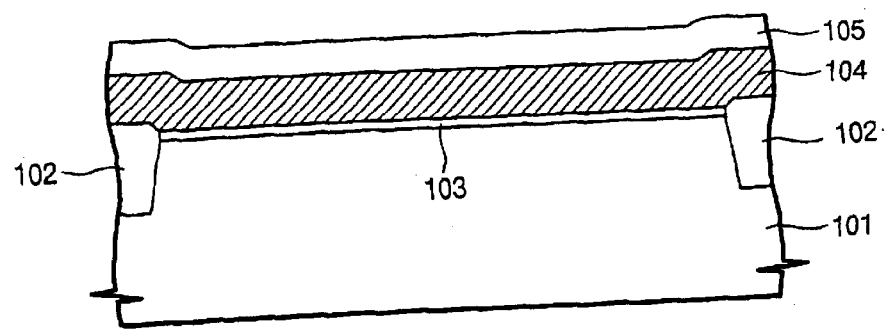
FIG. 2 through FIG. 5 are cross-sectional views illustrating steps of forming a semiconductor device according to embodiments of the present invention.

Referring to FIG. 2, a device isolation layer 102 is formed on a P-type semiconductor substrate 101 to define an active region. A gate insulating layer 103, a gate electrode layer 104, and a hard mask layer 105 are sequentially stacked on an entire surface of the semiconductor substrate 101 having the active region. The device isolation layer 102 may be a trench isolation layer, and the gate insulating layer 103 may be a thermal oxide layer that is used as a gate insulating layer. The gate electrode layer 104 may include doped polysilicon and/or polycide. Here, polycide may include doped polysilicon and metal silicide layers that are sequentially stacked. The hard mask layer 105 may be an insulating layer (e.g., a silicon nitride layer) having an etch selectivity with respect to the gate electrode layer 104 and with respect to a silicon oxide layer subsequently used as a typical interlayer insulating film.

Figure 3:
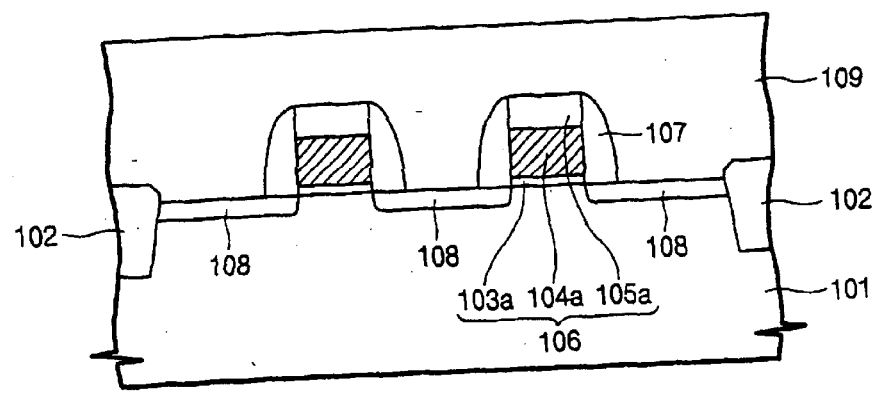
Figure 4:
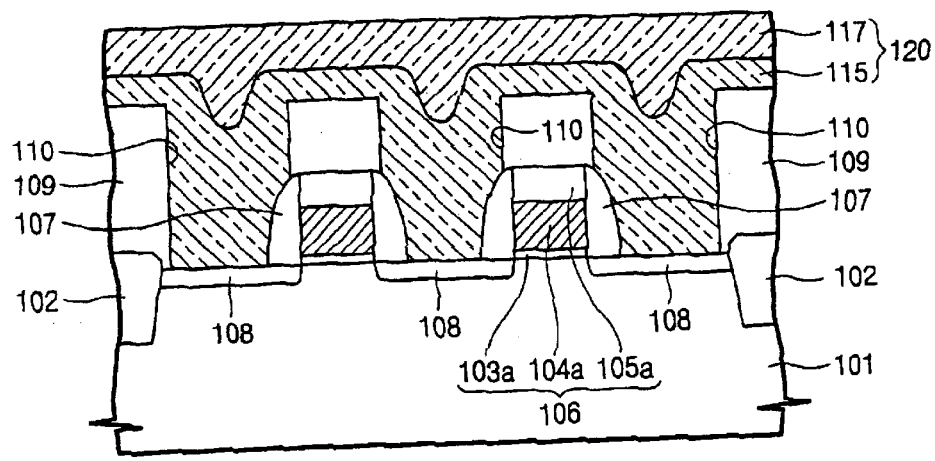
Figure 5:
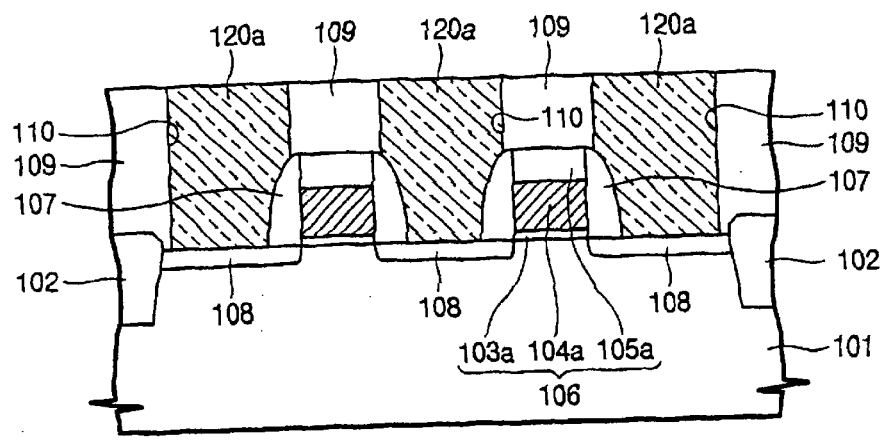

Referring to FIG. 3, the hard mask layer 105, the gate electrode layer 104, and the gate insulating layer 103 are sequentially patterned to form a gate insulating layer pattern 103a, a gate electrode 104a, and a hard mask pattern 105a that are sequentially stacked. The hard mask pattern 105a, the gate electrode 104a, and the gate insulating layer pattern 103a provide a gate pattern(s) 106 crossing the active region. Using the gate pattern 106 and the device isolation layer 102 as an ion-implanting mask, N-type impurities are implanted to form impurity diffusion regions 108 in the active region. A spacer 107 is formed on both sidewalls of the gate pattern 106. The spacer 107 may be an insulating layer (e.g., a silicon nitride layer) having an etch selectivity with respect to a silicon oxide layer subsequently used as a typical interlayer insulating film.

Following formation of the spacer 107, a heavily doped impurity diffusion layer (not shown) may be formed in exposed portions of the active region. This can be performed by implanting N-type impurities at a higher dose than that of the N-type impurities using gate patterns 106, spacers 107, and the device isolation layers 102 as an ion-implanting mask.

The N-type impurity diffusion regions 108 may provide respective source/drain regions. The N-type impurity diffusion regions 108 and the gate pattern 106 may provide a transistor. An interlayer insulating layer 109 is formed on an entire surface of a semiconductor substrate 10 1 including the N-type impurity diffusion regions 108. According to some embodiments, the interlayer insulating layer 109 can be a chemical vapor deposition (CVD) silicon oxide layer used as a typical interlayer insulating layer.

Referring to FIG. 4, FIG. 5, FIG. 6A, and FIG. 6B, the interlayer insulating layer 109 is patterned to form contact holes 110 exposing predetermined areas of the N-type impurity diffusion layers 108. In this case, the contact holes 110 may be self-aligned contact holes by using the spacers 107. That is, a portion of a sidewall of each contact hole 110 may be a respective spacer 107.

An arsenic doped polycrystalline silicon layer (hereinafter referred to as "As-doped polysilicon layer") 120 is formed on an entire surface of the semiconductor substrate 101 to fill the contact holes 110. The As-doped polysilicon layer 120 is doped with arsenic (As), and arsenic has a diffusion coefficient that is less than that of phosphorus (P) among elements selected from Group V of the periodic table by Mendeleef. The As-doped polysilicon layer 120 is planarized down to a top surface of the interlayer insulating film 109 to form contact plugs 120a in the contact hole 110.

The diffusion coefficient of arsenic (As) is 0.32 cm$^2$/sec, which is less than 10.5 cm$^2$/sec that is the diffusion coefficient of phosphorus (P). The diffusion coefficient of phosphorus (P) is about 33 times higher than that of As. Therefore, it is possible to reduce diffusion of impurities from the contact plugs 120a to the N-type impurity diffusion layers 108. Thus, a doping concentration of contact plugs 120a can be increased while not significantly increasing or reducing diffusion from the contact plugs to the N-type impurity diffusion layers 108. As a result, a punchthrough characteristic of the resulting transistor may be improved. Graphs illustrating improvement of punchthrough characteristics are illustrated in FIG. 6A and FIG. 6B.

In a first transistor, a width of the gate pattern 106 can be 0.205 micrometer and a length thereof can be 0.18 micrometer. The N-type impurity diffusion layer 108 of the first transistor is formed by implanting phosphorus (P) ions at a dose of $1.4 \times 10^{13}$ atoms/cm$^2$ with an energy of 20 KeV. The contact plug of the first transistor is made of polysilicon doped with phosphorus at a doping concentration of $1.0 \times 10^{20}$ atoms/cm$^3$.

A graph illustrating drain current as a function of gate voltage of the first transistor is illustrated in FIG. 6A. A curve 151 exhibits drain currents measured with variation of the gate electrode after applying a voltage of 0.1V to a drain of the first transistor. A curve 152 exhibits drain currents measured with variation of the gate electrode after applying a voltage of 2.0V to the drain of the first transistor. A gate voltage of the curve 151 corresponding to a predetermined drain current Idc (e.g., $10^{-7}$ A/$\mu$m) is 1.18V. A gate voltage of the curve 152 is 0.96V. A difference $\Delta$Va between the gate voltages is 0.22V.

A second transistor according to embodiments of the present invention includes a contact plug 120a of polysilicon doped with arsenic at a doping concentration of $3.0 \times 10^{20}$ atoms/cm$^3$. A graph illustrating drain current characteristics as a function of gate voltage of the second transistor is illustrated in FIG. 6B. A curve 161 illustrates drain currents measured with variation of the gate voltage after applying a voltage of 0.1V to the drain. A curve 162 illustrates drain currents measured with variation of the gate voltage after applying a voltage of 2.0V to the drain. When a predetermined drain current Idc is $10^{-7}$ A/$\mu$m, a gate voltage of the curve 161 is 0.98V and a gate voltage of the curve 162 is 0.93V. A difference $\Delta$Vb between the gate voltages is 0.05V.

Comparing the voltage differences $\Delta$Va and $\Delta$Vb with each other, the voltage difference $\Delta$Vb is smaller than the voltage difference $\Delta$Va. The As-doped polysilicon contact plug 120a may reduce diffusion of impurities from the contact plug 120a to the N-type impurity diffusion layer 108. In other words, because the N-type impurity diffusion layer 108 of a transistor according to embodiments of the present invention has a lower doping concentration than that of the transistor having a phosphorus doped polysilicon contact plug, an additional diffusion can be reduced. As a result, although a voltage applied to the drain may increase, a drain-induced barrier lowering (DIBL) phenomenon may be reduced thereby improving a punchthrough characteristic between the N-type impurity diffusion layers (source/drain regions) 108.

According to some embodiments, the As-doped polysilicon layer 120 may be formed using a single wafer type deposition apparatus. Because a single wafer type deposition apparatus may have a processing chamber receiving one wafer therein and a loadlock chamber, it may reduce an amount of externally provided oxygen as compared with a batch type deposition apparatus in which a plurality of wafers are processed at the same time. Accordingly, it may be possible to further suppress formation of a native oxide layer at an interface between the As-doped polysilicon layer 120 and the N-type impurity diffusion layer 180. As a result, a contact resistance of the As-doped polysilicon layer 120 and the N-type impurity diffusion layer 108 may be reduced. According to additional embodiments, the As-doped polysilicon layer 120 can be doped in the processing chamber using an in-situ technique.

In addition, the As-doped polysilicon layer 120 may be a dual layer in which a first As-doped polysilicon layer 115 and a second As-doped polysilicon layer 117 are sequentially stacked. By providing different deposition rates for the first and second As-doped polysilicon layers 115 and 117, void formation in the contact hole 110 may be reduced and a throughput of the As-doped polysilicon contact plug 120 may be enhanced. Here, a first As-doped polysilicon layer 115 is formed to partially fill the contact hole 110. A second As-doped polysilicon layer 117 is formed on the first As-doped polysilicon layer 115 to further fill the contact hole 110. In this case, the second As-doped polysilicon layer 117 has a high deposition rate relative to a deposition rate of the first As-doped polysilicon layer 115.

In other words, the first As-doped polysilicon layer 115 having a relatively low deposition rate (as compared to the relatively high deposition rate of the second As-doped polysilicon layer 117) may conformally fill the contact hole 110. Owing to the lower deposition rate, the first As-doped polysilicon layer 115 may provide a higher degree of step coverage as compared to the second As-doped polysilicon layer 117. Thus, an internal portion of the contact hole 110 may be filled without voids. As a result, an unfilled portion of the contact hole 110 may have a decreased aspect ratio when forming the second As-doped polysilicon layer 117. Because the second As-doped polysilicon layer 117 has a relatively high deposition rate (compared to the lower deposition rate of the first A-doped polysilicon layer 115) throughput may be increased when the second As-doped polysilicon layer 117 is formed on the first As-doped polysilicon layer 115.

According to some embodiments, the first As-doped polysilicon layer 115 can be formed at a deposition rate of about 100 Å/min~300 Å/min. According to additional embodiments, the second As-doped polysilicon layer 117 can be formed at a deposition rate of about 800 Å/min~1500 Å/min.

Figure 7:
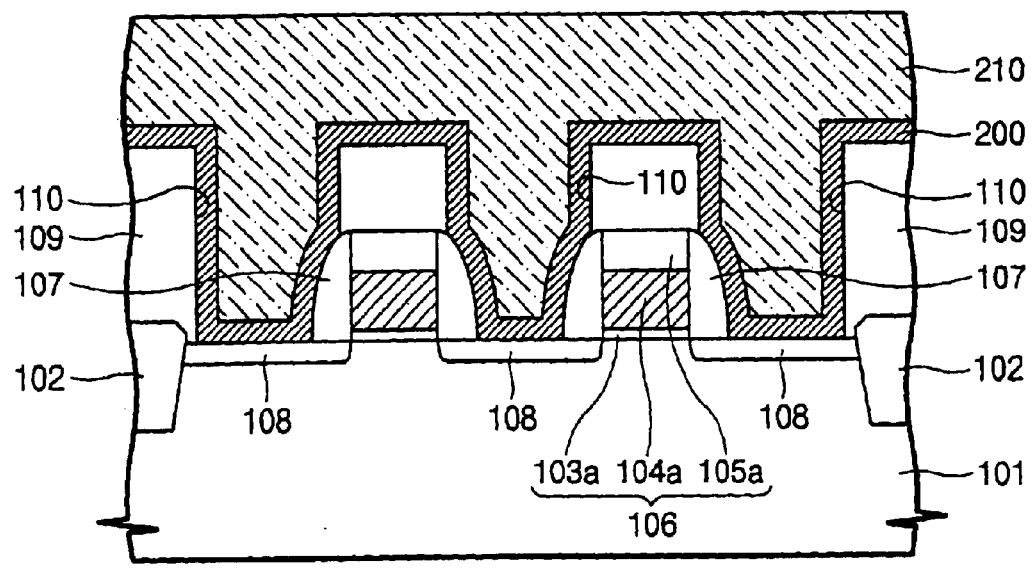
FIG. 7 and FIG. 8 are cross-sectional views illustrating steps of forming a semiconductor device according to additional embodiments of the present invention.
Figure 8:
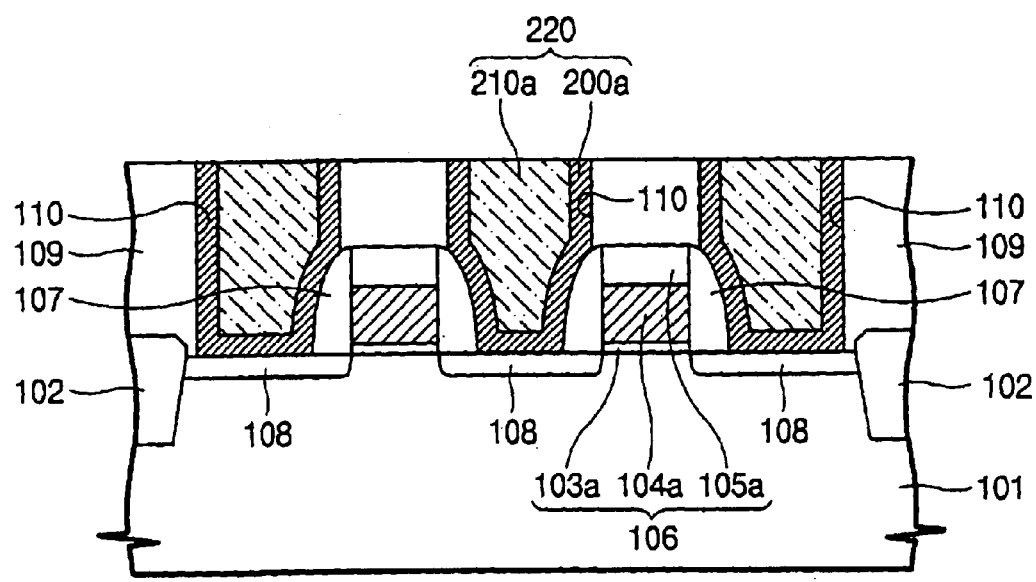

According to second embodiments of the present invention, a conductive layer filling a contact hole includes two layers doped with different impurities. FIG. 7 and FIG. 8 are cross-sectional views illustrating steps of forming a semiconductor device according to the second embodiments of the present invention. Steps of forming a gate pattern and an interlayer insulating film are the same as discussed in FIG. 2 and FIG. 3 and will not be discussed in further detail.

Referring to FIG. 7 and FIG. 8, an interlayer insulating film 109 is patterned to form contact holes 110 exposing predetermined areas of N-type impurity diffusion layers 108. An As-doped polysilicon layer 200 is formed on an entire surface of a semiconductor substrate 101 to provide conformal deposition in the contact hole 110. A phosphorus (P) doped polysilicon layer 210 is formed on the As-doped polysilicon layer 200 to fill the contact hole 110. Because polysilicon layer 200 is doped with arsenic (As) and arsenic has a diffusion coefficient less than that of phosphorus (P), diffusion of phosphorus (P) ions from the phosphorus (P) doped polysilicon layer 210 into the N-type impurity diffusion layer 108 may be reduced to enhance punchthrough characteristics of a transistor.

The phosphorus (P) doped polysilicon layer 210 and the As-doped polysilicon layer 200 can be planarized down to a top surface of the interlayer insulating film 109, forming an As-doped polysilicon layer pattern 200a and a phosphorus (P) doped polysilicon layer pattern 210a that are sequentially stacked. The patterns 200a and 210a provide a contact plug 220. Because the contact plug 220 includes the polysilicon layer pattern 210a doped with phosphorus (P) whose resistivity may be less than that of arsenic (As) doped polysilicon, a resistance of the contact plug 220 can be reduced.

According to some embodiments, the As-doped polysilicon layer 200 can be formed using a single wafer type deposition apparatus where a material layer is formed by inserting wafers into a processing chamber one by one. According to additional embodiments, the As-doped polysilicon layer 220 is doped using an in-situ technique so that formation and doping of the polysilicon layer are done concurrently.

The phosphorus (P) doped polysilicon layer 210 may also be formed using the same single wafer type deposition apparatus used to form the As-doped polysilicon layer. In the alternative, the phosphorus (P) doped polysilicon layer 210 may be formed using a batch type deposition apparatus. The phosphorus (P) doped polysilicon layer 210 may be doped using an in-situ technique, or the phosphorus (P) doped polysilicon layer 210 may be doped using POCl$_3$ following formation of an undoped polysilicon layer.

Methods according to embodiments of the present invention can reduce diffusion of impurities from a doped polysilicon layer filling a contact hole to impurity diffusion layers (such as source/drain regions) exposed by the contact hole.

According to embodiments of the present invention, a method of forming a semiconductor device can be provided. An interlayer insulating film is formed on an entire surface of a semiconductor substrate having an N-type impurity diffusion layer. The interlayer insulating film is patterned to form a contact hole exposing a predetermined area of the N-type impurity diffusion layer. A doped polysilicon layer is formed on an entire surface of a semiconductor substrate to fill the contact hole. The doped polysilicon layer includes at least a portion thereof doped with an element whose diffusion coefficient is less than that of phosphorus among elements selected from Group V of the periodic table by Mendeleef.

According to additional embodiments of the present invention, an N-type impurity diffusion layer is formed on a P-type semiconductor substrate. An interlayer insulating film is formed on an entire surface of the semiconductor substrate having the N-type impurity diffusion layer. The interlayer insulating film is patterned to form a contact hole exposing a predetermined area of the N-type impurity diffusion layer. An arsenic (As) doped polysilicon layer is formed to fill the contact hole.

To form the As doped polysilicon layer, a first As doped polysilicon layer is formed to partially fill the contact hole and a second As doped polysilicon layer is formed on the first As doped polysilicon layer to fill the contact hole. A deposition rate of the second As doped polysilicon layer is higher than that of the first As doped polysilicon layer.

According to yet additional embodiments of the present invention, a method of forming a semiconductor device includes forming an N-type active region on a P-type semiconductor substrate. An interlayer insulating film is formed on an entire surface of the semiconductor substrate having the N-type active region. The interlayer insulating film is patterned to form a contact hole exposing a predetermined area of the N-type active region. An arsenic (As) doped polysilicon layer is formed on an entire surface of a semiconductor substrate to conformally fill the contact hole. A phosphorus (P) doped polysilicon layer is formed on the As doped polysilicon layer to fill the contact hole.

It should be noted that many variations and modifications might be made to the embodiments described above without substantially departing from the principles of the present invention. All such variations and modifications are intended to be included herein within the scope of the present invention, as set forth in the following claims.

What is claimed is:

1. A method of forming a semiconductor device, the method comprising:

forming an insulating layer on a semiconductor substrate including a conductive region thereof, wherein the insulating layer has a contact hole therein exposing a portion of the conductive region; and forming a polysilicon contact plug in the contact hole wherein at least a portion of the polysilicon contact plug is doped with an element having a diffusion coeffient that is less than a diffusion coefficient of phosphorus (P) wherein forming the polysilicon contact plug comprises, forming a first portion of the polysilicon contact plug partially filling the contact hole while leaving an unfilled portion of the contact hole, wherein the first portion of the polysilicon contact plug is doped with the element having the diffusion coefficient that is less than the diffusion coefficient of phosphorus (P) wherein forming the first portion of the polysilicon contact plug comprises forming the first portion of the polysilicon contact plug using a single wafer type deposition apparatus, and after forming the first portion of the polysilicon contact plug, forming a second portion of the polysilicon contact plug in the unfilled portion of the contact hole wherein the second portion of the polysilicon contact plug is doped with an element different than the element used to dope the first portion of the polysilicon contact plug wherein forming the second portion of the polysilicon contact plug comprises forming the second portion of the polysilicon contact plug using a batch type deposition apparatus.

2. A method according to claim 1 wherein the element having the diffusion coefficient that is less than a diffusion coefficient of phosphorus (P) is selected from at least one element from Group V of the periodic table.

3. A method according to claim 1 wherein the element having the diffusion coefficient that is less than a diffusion coefficient of phosphorus (P) comprises at least one of arsenic and/or antimony.

4. A method according to claim 1 wherein the element having the diffusion coefficient that is less than a diffusion coefficient of phosphorus (P) comprises arsenic.

5. A method according to claim 1 wherein the conductive region of the semiconductor substrate comprises a region of the substrate doped with an N-type dopant.

6. A method according to claim 5 wherein the substrate comprises a P-type substrate.

7. A method according to claim 1 wherein forming the polysilicon contact plug comprises, forming a polysilicon layer in the contact hole and on a surface of the insulating layer opposite the semiconductor substrate, and removing portions of the polysilicon layer from the surface of the insulating layer opposite the semiconductor substrate while maintaining portions of the polysilicon layer in the contact hole.

8. A method according to claim 7 wherein removing portions of the polysilicon layer from the surface of the insulating layer comprises planarizing the polysilicon layer down to the surface of the insulating layer.

9. A method according to claim 1 wherein the second portion of the polysilicon contact plug is doped with phosphorus.

10. A method according to claim 9 wherein the first portion of the polysilicon contact plug is doped with arsenic.

11. A method according to claim 1 wherein forming the second portion of the polysilicon contact plug comprises doping the second portion of the polysilicon contact plug in-situ.

12. A method according to claim 1 wherein forming the second portion of the polysilicon contact plug comprises doping the second portion of the polysilicon contact plug using $POCl_3$.

13. A method according to claim 1 wherein forming the insulating layer is preceded by:

forming an isolation layer on the semiconductor substrate wherein the isolation layer defines an active region of the substrate not covered by the isolation layer;

forming a gate extending across the active region of the substrate; and forming a doped portion of the active region adjacent to the gate thereby defining the conductive region of the substrate.

14. A method according to claim 1 wherein forming the insulating layer comprises forming a silicon oxide layer.

15. A method according to claim 14 wherein forming the silicon oxide layer comprises forming the silicon oxide layer using chemical vapor deposition.

16. A method according to claim 1 wherein forming polysilicon contact plug comprises forming at least a portion of the polysilicon contact plug in a single wafer deposition apparatus.

17. A method according to claim 1 wherein the portion of the polysilicon contact plug doped with the element having the diffusion coefficient that is less than the diffusion coefficient of phosphorus (P) is doped in-situ.

18. A method of forming a semiconductor device, the method comprising:

forming an insulating layer on a semiconductor substrate including a conductive region thereof, wherein the insulating layer has a contact hole therein exposing a portion of the conductive region; and forming a polysilicon contact plug in the contact hole wherein at least a portion of the polysilicon contact plug is doped with an element having a diffusion coeffient that is less than a diffusion coefficient of phosphorus (P) wherein forming the polysilicon contact plug comprises, forming a first portion of the polysilicon contact plug at a first deposition rate wherein the first portion of the polysilicon contact plug partially fills the contact hole while leaving an unfilled portion of the contact hole, and after forming the first portion of the polysilicon contact plug, forming a second portion of the polysilicon contact plug at a second deposition rate wherein the second portion of the polysilicon contact plug is formed in the unfilled portion of the contact hole wherein the second deposition rate is greater than the first deposition rate.

19. A method according to claim 18 wherein forming the polysilicon contact plug comprises, forming a first portion of the polysilicon contact plug partially filling the contact hole while leaving an unfilled portion of the contact hole, wherein the first portion of the polysilicon contact plug is doped with the element having the diffusion coefficient that is less than the diffusion coefficient of phosphorus (P), and after forming the first portion of the polysilicon contact plug, forming a second portion of the polysilicon contact plug in the unfilled portion of the contact hole wherein the second portion of the polysilicon contact plug is doped with an element different than the element used to dope the first portion of the polysilicon contact plug.

20. A method according to claim 19 wherein forming the first portion of the polysilicon contact plug comprises forming the first portion of the polysilicon contact plug using a single wafer type deposition apparatus having a processing chamber that receives one wafer therein, and wherein forming the second portion of the polysilicon contact plug comprises forming the second portion of the polysilicon contact plug using a batch type deposition apparatus that processes a plurality of wafers at a same time.

21. A method according to claim 19 wherein forming the first portion of the polysilicon contact plug comprises forming the first portion of the polysilicon contact plug using a single wafer type deposition apparatus, and wherein forming the second portion of the polysilicon contact plug comprises forming the second portion of the polysilicon contact plug using a single wafer type deposition apparatus.

22. A method according to claim 18 wherein the second portion of the polysilicon contact plug is doped with phosphorus.

23. A method according to claim 22 wherein the first portion of the polysilicon contact plug is doped with arsenic.

24. A method of forming a semiconductor device, comprising:

forming an interlayer insulating film on an entire surface of a semiconductor substrate having an N-type impurity diffusion layer, the interlayer insulating film having a contact hole therein exposing a portion of the N-type impurity diffusion layer; and forming a doped polysilicon layer on an entire surface of the semiconductor substrate to fill up the contact hole, wherein the forming the doped polysilicon layer comprises:

forming a first arsenic (As) doped polysilicon layer to partially fill the contact hole; and forming a second arsenic (As) doped polysilicon layer on the first arsenic (As) doped polysilicon layer to fill the contact hole, wherein the second arsenic (As) doped polysilicon layer has a high deposition rate as compared to the first arsenic (As) doped polysilicon layer.

25. The method as recited in claim 24, wherein the doped polysilicon layer consists of an arsenic (As) doped polysilicon layer and a phosphorus (P) doped polysilicon layer that are sequentially stacked.

26. The method as recited in claim 24, after formation of the doped polysilicon layer, further comprising planarizing the doped polysilicon layer down to a top surface of the interlayer insulating film to form a contact plug in the contact hole.

27. A method of forming a semiconductor device, comprising:

forming an N-type impurity diffusion layer at a P-type semiconductor substrate;

forming an interlayer insulating film on an entire surface of a semiconductor substrate including the N-type impurity diffusion layer;

patterning the interlayer insulating film to form a contact hole exposing a predetermined area of the N-type impurity diffusion layer; and forming an arsenic (As) doped polysilicon layer to fill the contact hole wherein the forming the arsenic (As) doped polysilicon layer comprises:

forming a first arsenic (As) doped polysilicon layer to partially fill the contact hole; and forming a second arsenic (As) doped polysilicon layer on the first arsenic (As) doped polysilicon layer to fill the contact hole, wherein the second arsenic (As) doped polysilicon layer has a high deposition rate as compared to the first arsenic (As) doped polysilicon layer.

28. The method as recited in claim 27, wherein the forming the N-type impurity diffusion layer comprises:

forming a device isolation layer at the P-type semiconductor substrate to define an active region;

forming a gate pattern crossing the active region; and implanting N-type impurities into active regions adjacent to opposite sides of the gate pattern to form the N-type impurity diffusion layer.

29. The method as recited in claim 27, wherein the interlayer insulating film is made of chemical vapor deposition (CVD) silicon oxide.

30. The method as recited in claim 27, wherein the arsenic (As) doped polysilicon layer is formed using a single wafer type deposition apparatus.

31. The method as recited in claim 27, wherein the arsenic (As) doped polysilicon layer is formed by an in-situ manner.

32. The method as recited in claim 27, after forming the arsenic (As) doped polysilicon layer, further comprising planarizing the arsenic (As) doped polysilicon layer down to a top surface of the interlayer insulating film to form a contact plug in the contact hole.

* * * * *